(12) United States Patent
Chen

(10) Patent No.: US 10,693,446 B1
(45) Date of Patent: Jun. 23, 2020

(54) CLOCK ADJUSTMENT CIRCUIT AND CLOCK ADJUSTMENT METHOD

(71) Applicant: REALTEK SEMICONDUCTOR CORPORATION, Hsinchu (TW)

(72) Inventor: Chien-Wen Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/791,144

(22) Filed: Feb. 14, 2020

Related U.S. Application Data

(62) Division of application No. 16/381,325, filed on Apr. 11, 2019.

(30) Foreign Application Priority Data

Jun. 19, 2018 (TW) .............................. 107120898 A

(51) Int. Cl.
*H03K 5/156* (2006.01)
*G06F 1/04* (2006.01)
*H03K 5/151* (2006.01)
*H03K 5/00* (2006.01)

(52) U.S. Cl.
CPC ............ *H03K 5/1565* (2013.01); *G06F 1/04* (2013.01); *H03K 5/00006* (2013.01); *H03K 5/151* (2013.01)

(58) Field of Classification Search
CPC ................................ H03K 5/1565; G06F 1/04
USPC .................... 327/175, 158, 159, 116
See application file for complete search history.

(56) References Cited

U.S. PATENT DOCUMENTS

| | | | | | |
|---|---|---|---|---|---|
| 5,554,945 | A | * | 9/1996 | Lee | H03H 11/20 327/105 |
| 5,864,246 | A | * | 1/1999 | Anderson | H03B 19/14 327/116 |
| 5,945,857 | A | | 8/1999 | Havens | |
| 6,426,660 | B1 | * | 7/2002 | Ho | H03K 5/00006 327/115 |

(Continued)

OTHER PUBLICATIONS

Hwang-Cherng Chow, "Duty Cycle Adjusting Circuit for Clock Signals", Apr. 2005, Department of Electronics Engineering, Chang Gung University.

(Continued)

*Primary Examiner* — Tomi Skibinski
(74) *Attorney, Agent, or Firm* — WPAT, PC

(57) ABSTRACT

Clock adjustment circuits and clock adjustment methods are provided. The clock adjustment circuit is configured to generate an output clock and includes a phase interpolator, a logic circuit, and an integrator. The phase interpolator is configured to generate by interpolation an intermediate clock according to a first reference clock, a second reference clock, and a control signal. The frequencies of the first reference clock, the second reference clock and the intermediate clock are substantially the same. The logic circuit is coupled to the phase interpolator and configured to generate the output clock according to the intermediate clock and one of the first reference clock and the second reference clock. The integrator is coupled to the phase interpolator and the logic circuit and configured to generate the control signal according to the output clock. The control signal varies with an average based on a duty cycle of the output clock.

10 Claims, 17 Drawing Sheets

(56) References Cited

U.S. PATENT DOCUMENTS

| | | |
|---|---|---|
| 6,643,790 B1 | 11/2003 | Yu et al. |
| 6,819,155 B1 | 11/2004 | Ling et al. |
| 7,525,358 B1 | 4/2009 | Taft et al. |
| 2016/0072620 A1 | 3/2016 | Gorecki et al. |

OTHER PUBLICATIONS

Sharath Patil et al., "Duty Cycle Correction Using Negative Feedback Loop", Jun. 25-27, 2009, pp. 424-426, Department of Microelectronics & Computer Science, Technical University of Lodz.

R. Oortgiesen et al., "Feasibility Study of Frequency Doubling using a Dual-Edge Method", Nov. 2010, University of Twente.

Sangwoo Han et al., "A 0.5-2.0 GHz Dual-Loop SAR-controlled Duty-Cycle Corrector Using a Mixed Search Algorithm", Apr. 2013, vol. 13, No. 2, Journal of Semiconductor Technology and Science.

OA letter of counterpart TW application of application No. 107120898 dated Oct. 24, 2018. Summary of the OA letter(Oct. 24, 2018): Claims 1-2 and 4-5 are anticipated by reference 1(U.S. Pat. No. 6,643,790 B1).

OA letter of counterpart TW application of application No. 107120898 dated Dec. 13, 2018. Summary of the OA letter(Dec. 13, 2018): Reference 1(U.S. Pat. No. 6,643,790 B1) renders Claims 1-2 and 4-10 obvious.

OA letter of TW application (appl. No. 108109717) dated Aug. 28, 2019. Summary of the OA letter: 1) Claims 1 and 4 are anticipated by reference 1 (US20160072620). 2) Reference 1(US 20160072620) renders claims 6 and 9 obvious.

\* cited by examiner

CLOCK ADJUSTMENT CIRCUIT AND CLOCK ADJUSTMENT METHOD

BACKGROUND

1. Field of the Disclosure

The present disclosure generally relates to circuit clocks, and, more particularly, to duty cycle correction (DCC) and/or frequency multipliers.

2. Description of Related Art

FIG. 1 is a schematic diagram of a conventional duty cycle correction (DCC) circuit. The DCC circuit 100 includes a frequency divider 110, a frequency multiplier circuit 120, a filter 130, a filter 140, and an integrator 150. The DCC circuit 100 is intended to correct the duty cycle of the input clock CLKIN such that the duty cycle of the corrected clock (i.e., the output clock CLKOUT) is close or equal to 50%. The frequency divider 110 divides the input clock CLKIN to generate a signal VA. The frequency of the signal VA is a half of that of the input clock CLKIN, and the duty cycle of the signal VA is 50%. The signal VA is multiplied by the frequency multiplier circuit 120, which includes the delay circuit 122 and the exclusive OR (XOR) gate 124; thus an output clock CLKOUT is obtained. The frequency of the output clock CLKOUT and the frequency of the input clock CLKIN are substantially the same. The filter 130, which includes the resistor R1 and capacitor C1, and the filter 140, which includes the resistor R2 and capacitor C2, filter the output clock CLKOUT and the signal VA, respectively, to extract the low frequency components (an average based on duty cycle). The integrator 150 includes a comparator 155 and a capacitor C3. The comparator 155 determines to charge or discharge the capacitor C3 according to the direct current (DC) level of the signal VA and the DC level of the output clock CLKOUT. The level of the control signal Vctrl (i.e., the terminal voltage of the capacitor C3) is related to the duty cycle of the output clock CLKOUT—a change in the duty cycle of the output clock CLKOUT (the duty cycle becoming greater or smaller than 50%) gives rise to a change in the level of the control signal Vctrl, which in turn causes the duty cycle of the output clock CLKOUT to be 50%. The duty cycle of the output clock CLKOUT can be controlled to be approximately 50% by adjusting the delay time of the delay circuit 122 using the control signal Vctrl.

FIG. 2 is a schematic diagram of a conventional frequency multiplier circuit. The frequency multiplier circuit 200 includes a phase detecting circuit 210, a charge pump 220, a loop filter 230 (including a capacitor C), a delay circuit 240, and an edge combining circuit 250. The phase detecting circuit 210, the charge pump 220, the loop filter 230, and the delay circuit 240 (including a plurality of delay units Td) constitute a delay lock loop (DLL). That is, the clock CLKFB has substantially the same frequency and phase as the input clock CLKIN. The delay time of the delay units Td is controlled by the control signal Vctrl (i.e., the terminal voltage of the capacitor C). The edge combining circuit 250 generates the output clock CLKOUT according to the clock edge of the delay clock CLKIND and the clock edge of the input clock CLKIN. When the delay clock CLKIND and the input clock CLKIN are out of phase by 180 degrees, the frequency of the output clock CLKOUT is twice the frequency of the input clock CLKIN and has a duty cycle of 50%.

The circuits of FIGS. 1 and 2 are complex and tend to generate noises; there is a need to provide a more concise circuit.

SUMMARY

In view of the issues of the prior art, an object of the present disclosure is to provide a clock adjustment circuit and a clock adjustment method to simplify the duty cycle correction (DCC) circuit and/or the frequency multiplier.

A clock adjustment circuit configured to adjust an input clock to generate an output clock is provided. The clock adjustment circuit includes a low-pass filter, a DC control circuit, a DC offset amplifier, an amplifier, and an integrator. The low-pass filter is configured to filter the input clock to generate a filtered signal. The DC control circuit is configured to adjust a DC voltage according to a control signal. The DC offset amplifier is coupled to the low-pass filter and the DC control circuit and configured to generate an intermediate clock according to the filtered signal and the DC voltage. The amplifier is coupled to the DC offset amplifier and configured to generate the output clock according to the intermediate clock. The integrator is coupled to the DC offset amplifier and the DC control circuit and configured to generate the control signal according to the output clock. The control signal varies with an average based on a duty cycle of the output clock.

A clock adjustment method for adjusting an input clock to generate an output clock is also provided. The method includes the steps of: filtering the input clock to generate a filtered signal; generating an intermediate clock according to the filtered signal and a DC voltage; generating the output clock according to the intermediate clock; generating a control signal according to the output clock, the control signal varying according to an average based on a duty cycle of the output clock; and adjusting the DC voltage according to the control signal.

A clock adjustment circuit configured to generate an output clock is also provided. A clock adjustment circuit includes a phase interpolator, a logic circuit, and an integrator. The phase interpolator is configured to generate by interpolation an intermediate clock according to a first reference clock, a second reference clock, and a control signal. The frequency of the first reference clock, the frequency of the second reference clock, and the frequency of the intermediate clock are substantially the same. The logic circuit is coupled to the phase interpolator and configured to generate the output clock according to the intermediate clock and one of the first reference clock and the second reference clock. The integrator is coupled to the phase interpolator and the logic circuit and configured to generate the control signal according to the output clock. The control signal varies with an average based on a duty cycle of the output clock.

A clock adjustment method for generating an output clock is also provided. The method includes the steps of: generating by interpolation an intermediate clock according to a first reference clock, a second reference clock, and a control signal, the frequency of the first reference clock, the frequency of the second reference clock, and the frequency of the intermediate clock being substantially the same; generating the output clock according to the intermediate clock and one of the first reference clock and the second reference clock; and generating the control signal according to the output clock. The control signal varies with an average based on a duty cycle of the output clock.

A clock adjustment circuit configured to generate an output clock is also provided. The clock adjustment circuit includes a phase interpolator, an amplifier, a logic circuit, and an integrator. The phase interpolator is configured to generate by interpolation an intermediate clock according to a first reference clock, a second reference clock, and a control signal. The frequency of the first reference clock, the frequency of the second reference clock, and the frequency of the intermediate clock are substantially the same. The amplifier is coupled to the phase interpolator and configured to amplify the intermediate clock to generate an amplified intermediate clock. The logic circuit is coupled to the amplifier and configured to generate the output clock according to the amplified intermediate clock and one of the first reference clock and the second reference clock. The integrator is coupled to the phase interpolator and the logic circuit and configured to generate the control signal according to the output clock. The control signal varies with an average based on a duty cycle of the output clock.

A clock adjustment method for generating an output clock is also provided. The method includes: generating by interpolation an intermediate clock according to a first reference clock, a second reference clock, and a control signal, the frequency of the first reference clock, the frequency of the second reference clock, and the frequency of the intermediate clock being substantially the same; amplifying the intermediate clock to generate an amplified intermediate clock; and generating the output clock according to the amplified intermediate clock and one of the first reference clock and the second reference clock; and generating the control signal according to the output clock. The control signal with an average based on a duty cycle of the output clock.

Compared with the conventional circuit, the clock adjustment method and the clock adjustment circuit provided in the present disclosure are simpler, easier to implement, and having fewer noises.

These and other objectives of the present disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes clock adjustment circuits and clock adjustment methods. On account of that some or all elements of the clock adjustment circuits could be known, the detail of such elements is omitted provided that such detail has little to do with the features of this disclosure and this omission nowhere dissatisfies the specification and enablement requirements. Some or all of the processes of clock adjustment methods can be performed by the clock adjustment circuits or their equivalents. A person having ordinary skill in the art can choose components or steps equivalent to those described in this specification to carry out the present disclosure, which means that the scope of this disclosure is not limited to the embodiments in the specification.

Figure 1:
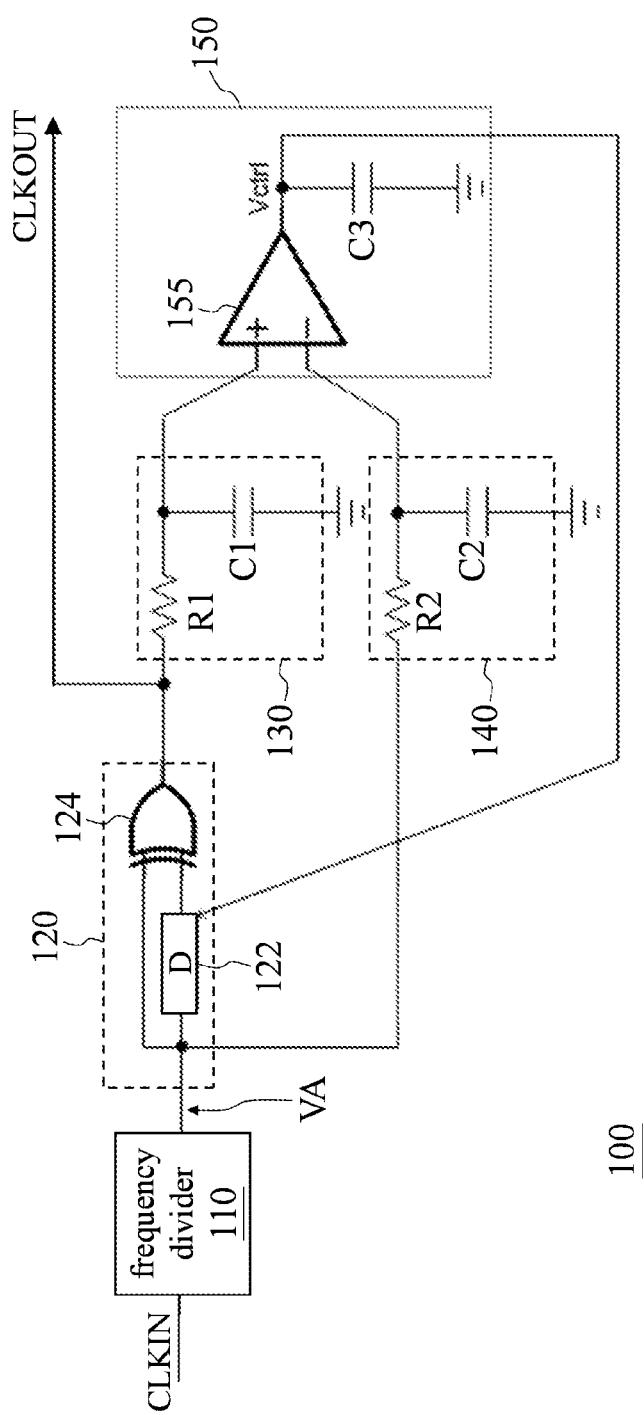
FIG. 1 illustrates a schematic diagram of a conventional duty cycle correction (DCC) circuit.
Figure 2:
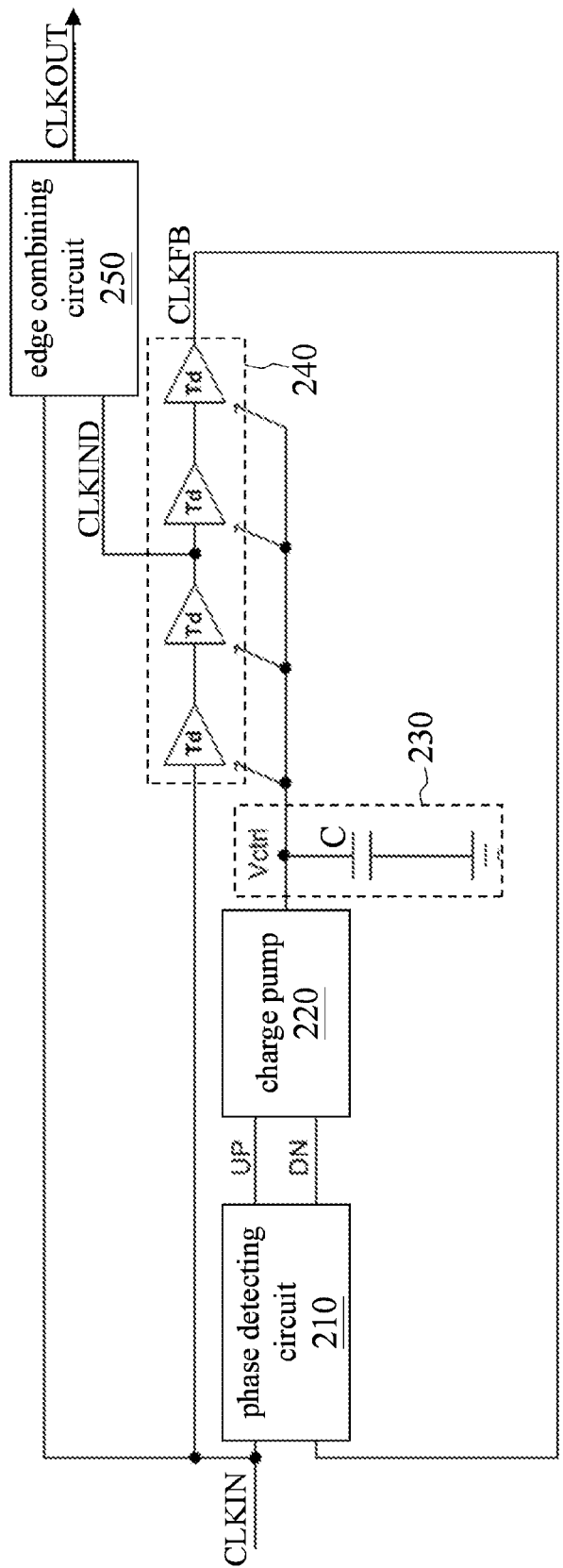
FIG. 2 illustrates a schematic diagram of a conventional frequency multiplier circuit.
Figure 3:
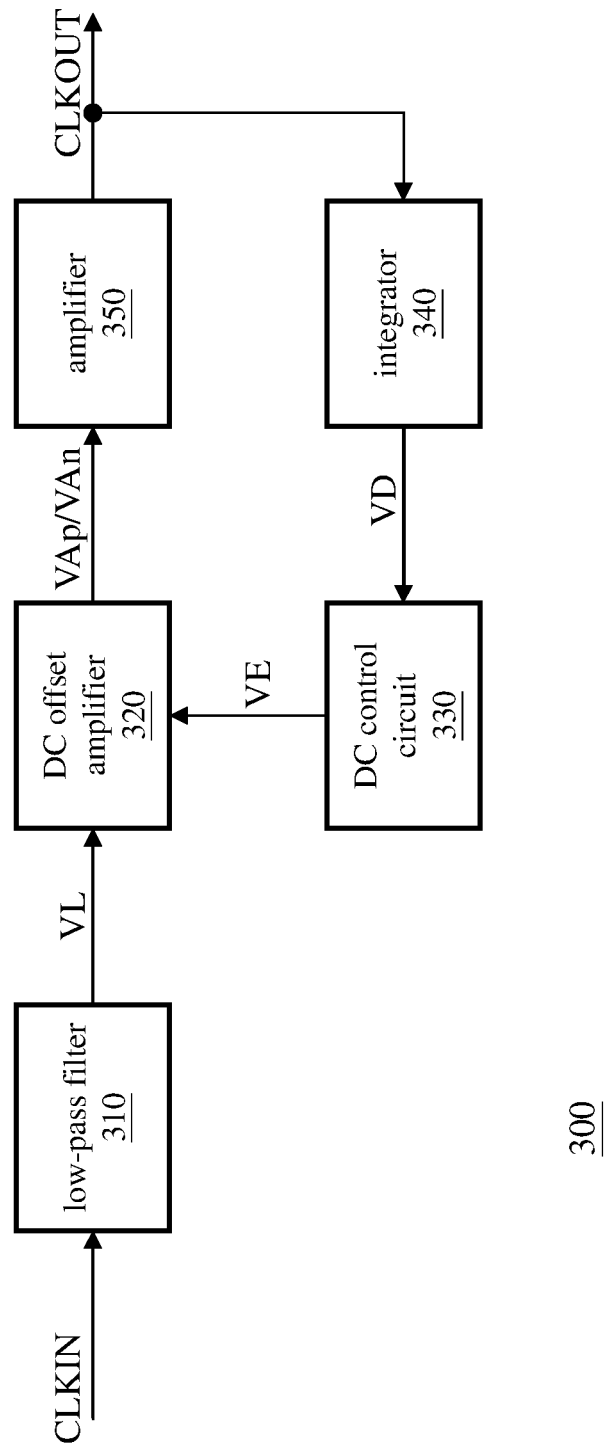
FIG. 3 illustrates a functional block diagram of a clock adjustment circuit according to an embodiment of the present disclosure.
Figure 4:
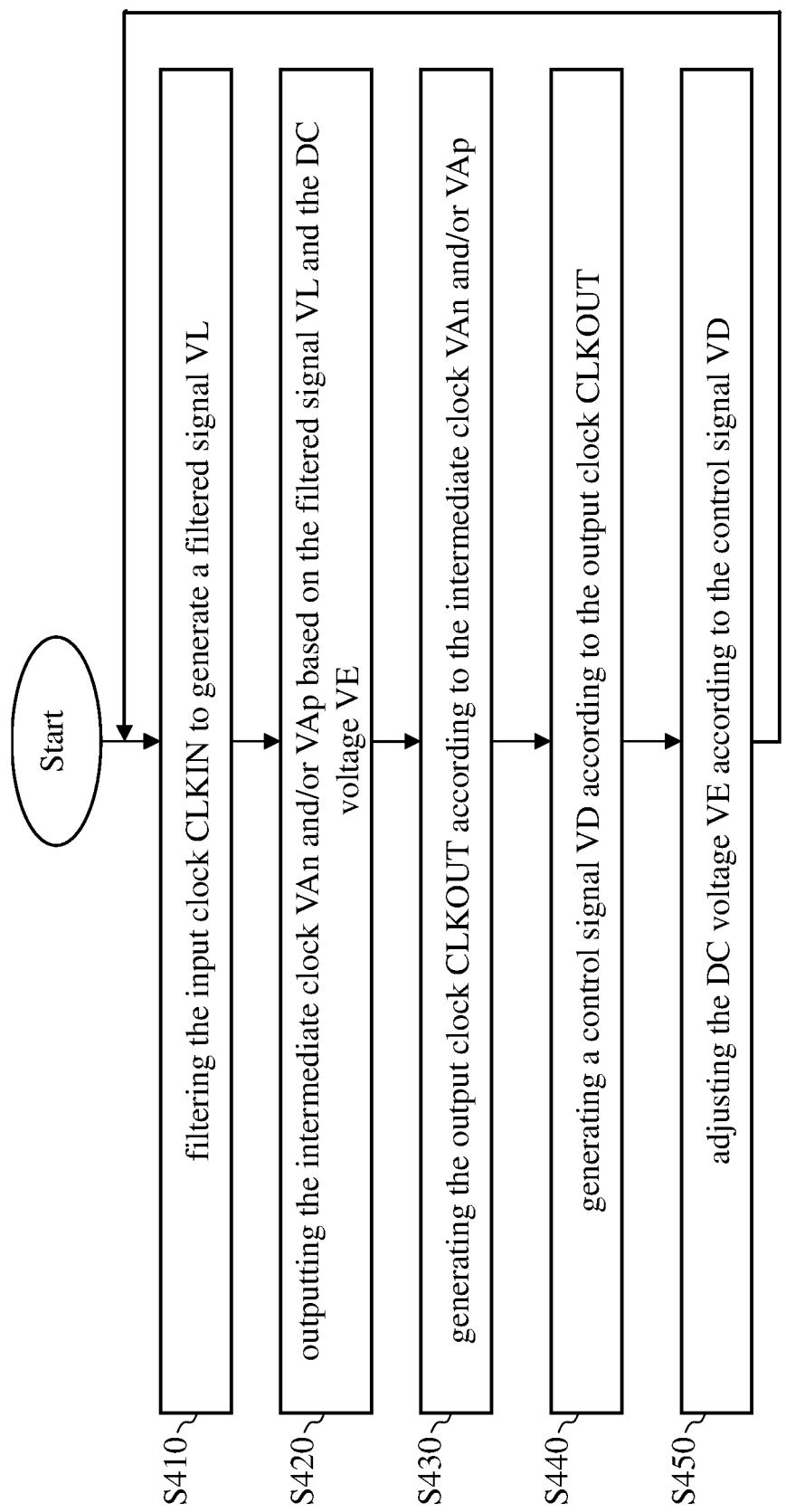
FIG. 4 illustrates a flowchart of the clock adjustment method according to an embodiment of the present disclosure.
Figure 5:
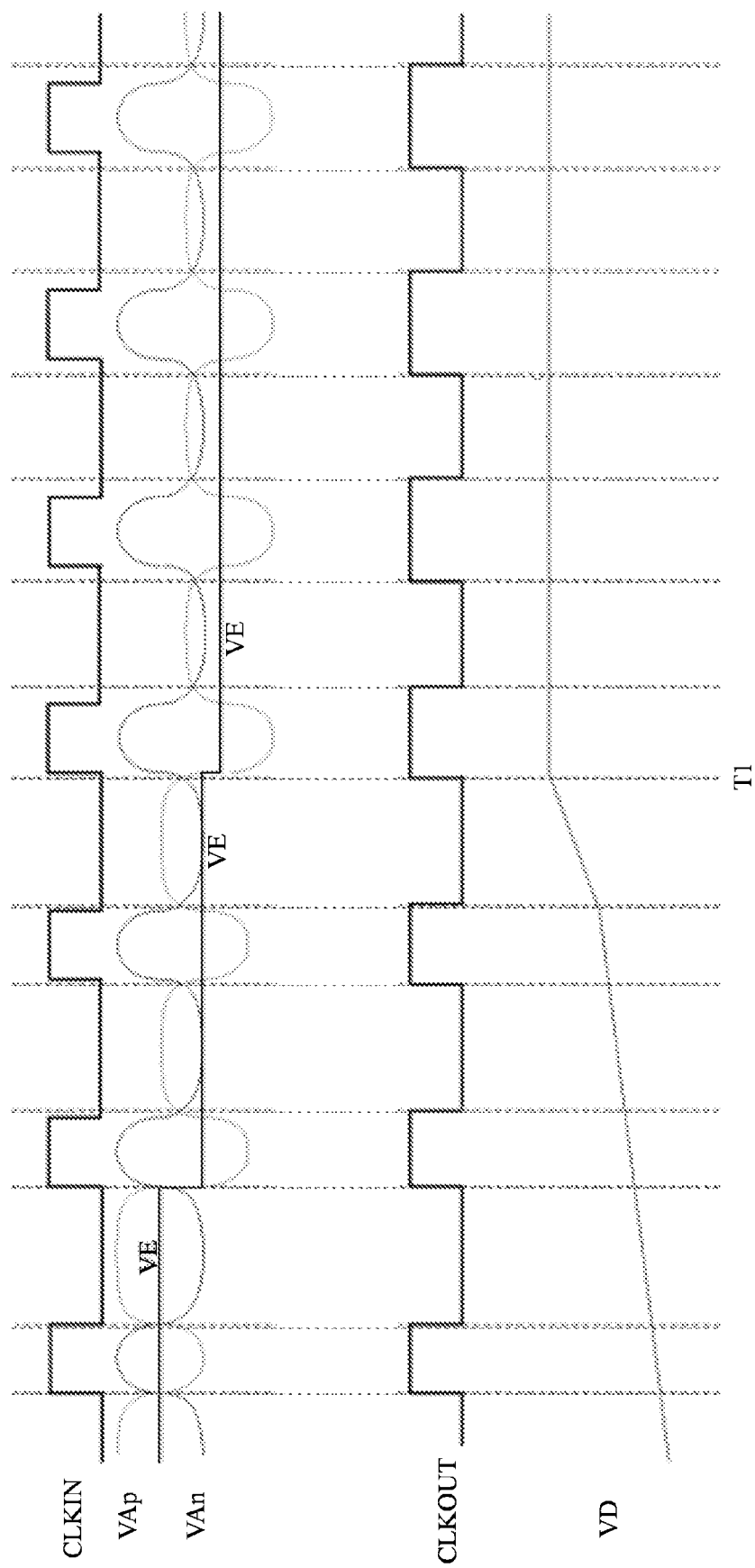
FIG. 5 illustrates the waveform of each signal in FIG. 3.

FIG. 3 is a functional block diagram of a clock adjustment circuit according to an embodiment of the present disclosure. The clock adjustment circuit 300 includes a low-pass filter 310, a direct current (DC) offset amplifier 320, a DC control circuit 330, an integrator 340, and an amplifier 350. FIG. 4 is a flowchart of the clock adjustment method according to an embodiment of the present disclosure (corresponding to the device of FIG. 3). FIG. 5 shows the waveform of each signal in FIG. 3. The low-pass filter 310 filters the input clock CLKIN to generate a filtered signal VL (step S410). The filtered signal VL can be a sinewave like signal. The DC offset amplifier 320 then outputs the intermediate clock VAn and/or the intermediate clock VAp based on the filtered signal VL and the DC voltage VE (step S420). More specifically, the waveform of the intermediate clock VAn (or intermediate clock VAp) is similar to that of the filtered signal VL, but the amplitude of the intermediate clock VAn (or intermediate clock VAp) is greater than or equal to that of the filtered signal VL. In addition to signal amplification, the DC offset amplifier 320 also adjusts the DC level of the intermediate clock VAn (or intermediate clock VAp) according to the DC voltage VE. Next, the amplifier 350 generates the output clock CLKOUT according to the intermediate clock VAn and/or the intermediate clock VAp (step S430). In some embodiments, when the intermediate clock VAn is greater than the intermediate clock VAp, the output of the amplifier 350 (i.e., the output clock CLKOUT) is at a high voltage level; when the intermediate clock VAn is smaller than the intermediate clock VAp, the output of the amplifier 350 is at a low voltage level. In some embodiments, the amplifier 350 compares the intermediate clock VAn with a DC voltage or compares the intermediate clock VAp with a DC voltage, to generate the output clock CLKOUT. The output clock CLKOUT outputted by the amplifier 350 is the signal or clock generated by adjusting the input clock CLKIN. The amplifier 350 can be realized using a swing amplifier. The swing amplifier is a well-known component, and its descriptions are thus omitted for brevity.

The integrator 340 generates a control signal VD according to the output clock CLKOUT (step S440). The control signal VD varies with the average based on the duty cycle of the output clock CLKOUT, and the average based on the duty cycle of the output clock CLKOUT is positively correlated with the duty cycle of the output clock CLKOUT. For example, the integrator 340 can (1) decrease (or increase) the voltage level of the control signal VD when the duty cycle of the output clock CLKOUT is greater than (or smaller than) a target value (e.g., 50%); or (2) increase (or decrease) the voltage level of the control signal VD when the duty cycle of the output clock CLKOUT is greater than (or smaller than) the target value. The illustrative waveform of FIG. 5 corresponds to the foregoing method (1). The duty cycle of the output clock CLKOUT is smaller than 50% before time T1 and remains constant after reaching 50% at time T1. The change in the control signal VD reflects the change in the duty cycle of the output clock CLKOUT, which increases before time T1 and remains constant after time T1.

The DC control circuit 330 adjusts the DC voltage VE according to the control signal VD (step S450). In some embodiments, the DC voltage VE is a DC signal, and the DC control circuit 330 adjusts the DC voltage VE according to the two adjustment methods of the integrator 340 discussed above; that is, (1) decreases (or increases) the DC voltage VE as the control signal VD increases (or decreases); or (2) increases (or decreases) the DC voltage VE as the control signal VD increases (or decreases). The illustrative waveform of FIG. 5 corresponds to the foregoing method (1)— before time T1, the DC control circuit 330 decreases the DC voltage VE according to the constantly rising control signal VD. In some embodiments, the DC voltage VE determines the DC level of the intermediate clock VAp (as shown in the waveform of FIG. 5). The clock adjustment circuit 300 automatically repeats steps S410 to S450. As the control signal VD and the DC voltage VE change, the duty cycle of the output clock CLKOUT gradually approaches the target value; thus, the purpose of adjusting the clock is achieved.

Figure 6:
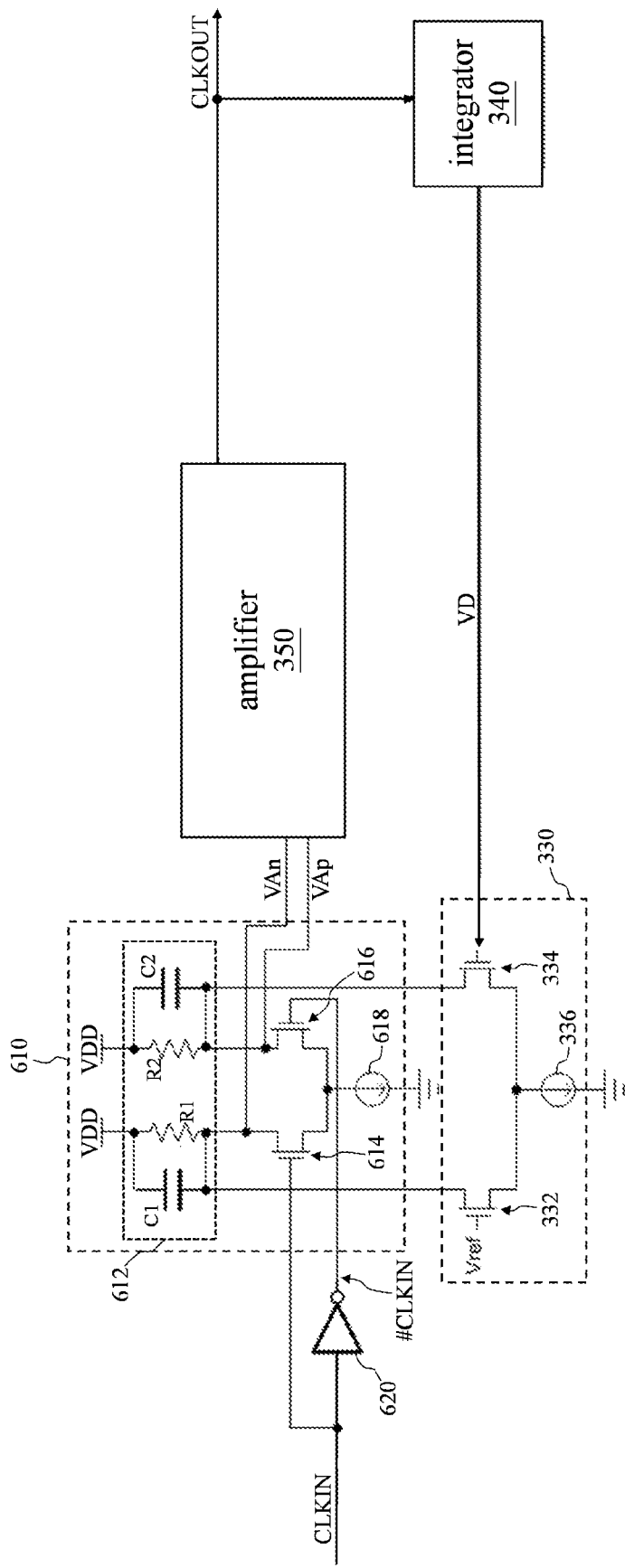
FIG. 6 illustrates a detailed circuit diagram of the low-pass filter 310, the DC offset amplifier 320, and the DC control circuit 330 according to one embodiment.

FIG. 6 shows a detailed circuit diagram of the low-pass filter 310, the DC offset amplifier 320, and the DC control circuit 330 according to one embodiment. The low-pass filtering and DC offset amplifier circuit 610 includes a filter circuit 612, a transistor 614, a transistor 616, and a current source 618 to realize the functions of the low-pass filter 310 and the DC offset amplifier 320. The gate of the transistor 614 receives the input clock CLKIN, the intermediate clock VAn is outputted through the drain of the transistor 614, and the source of the transistor 614 is coupled to the first reference voltage (e.g., ground) through the current source 618. The gate of the transistor 616 receives the inverted signal # CLKIN, which is generated by the inverter 620, of the input clock CLKIN, the intermediate clock VAp is outputted through the drain of the transistor 616, and the source of the transistor 616 is coupled to the first reference voltage through the current source 618. The filter circuit 612 includes a capacitor C1 and a resistor R1 connected in parallel as well as a capacitor C2 and a resistor R2 connected in parallel. One end of the capacitor C1 is coupled to the drain of the transistor 614, and the other end is coupled to a second reference voltage (e.g., the voltage source VDD). One end of the resistor R1 is coupled to the drain of the transistor 614, and the other end is coupled to the second reference voltage. One end of the capacitor C2 is coupled to the drain of the transistor 616, and the other end is coupled to the second reference voltage. One end of the resistor R2 is coupled to the drain of the transistor 616, and the other end is coupled to the second reference voltage.

The DC control circuit 330 includes a transistor 332, a transistor 334, and a current source 336. The gate of the transistor 332 receives the reference signal Vref, which may be a constant voltage, the drain of the transistor 332 is coupled to the drain of the transistor 614, and the source of the transistor 332 is coupled to the first reference voltage through the current source 336. The gate of the transistor 334 receives the control signal VD, the drain of the transistor 334 is coupled to the drain of the transistor 616, and the source of the transistor 334 is coupled to the first reference voltage through the current source 336.

The low-pass filtering and DC offset amplifier circuit 610 has both filtering and amplification functions. The input clock CLKIN and its inverted signal # CLKIN are amplified by the transistor 614 and the transistor 616, respectively, and the amplified input clock CLKIN and the amplified signal # CLKIN are filtered by the filter circuit 612. The filtered and amplified signals (i.e., the intermediate clock VAn and the intermediate clock VAp) are outputted through the drain of the transistor 614 and the drain of the transistor 616. The DC level of the drain of the transistor 614 and the DC level of the drain of the transistor 616 are controlled by the DC control circuit 330. The DC levels of the intermediate clock VAn and the intermediate clock VAp can be adjusted by adjusting the reference signal Vref and the control signal VD, respectively.

Figure 7:
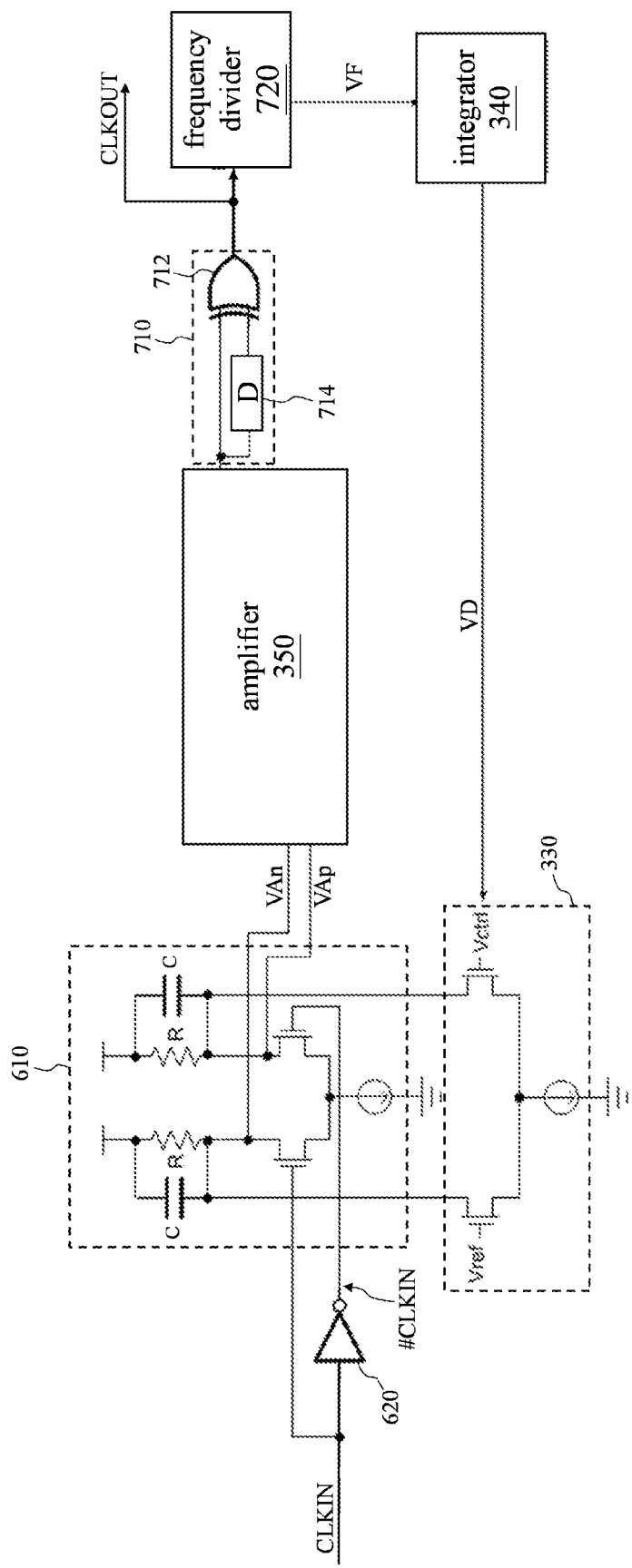
FIG. 7 illustrates a circuit diagram of a clock adjustment circuit according to another embodiment of the present disclosure.

FIG. 7 is a circuit diagram of a clock adjustment circuit according to another embodiment of the present disclosure. Compared with FIG. 6, the clock adjustment circuit of FIG. 7 further includes a frequency multiplier circuit 710 and a frequency divider 720. After being adjusted by the frequency multiplier circuit 710 that includes the XOR gate 712 and the delay circuit 714, the frequency of the output clock CLKOUT is twice the frequency of the input clock CLKIN while the duty cycle is still maintained at the target value. The frequency divider 720 divides the output clock CLKOUT such that the frequency of the signal VF is the same as the frequency of the input clock CLKIN. The clock adjustment circuit of FIG. 7 can be used as a frequency multiplier circuit.

Figure 8:
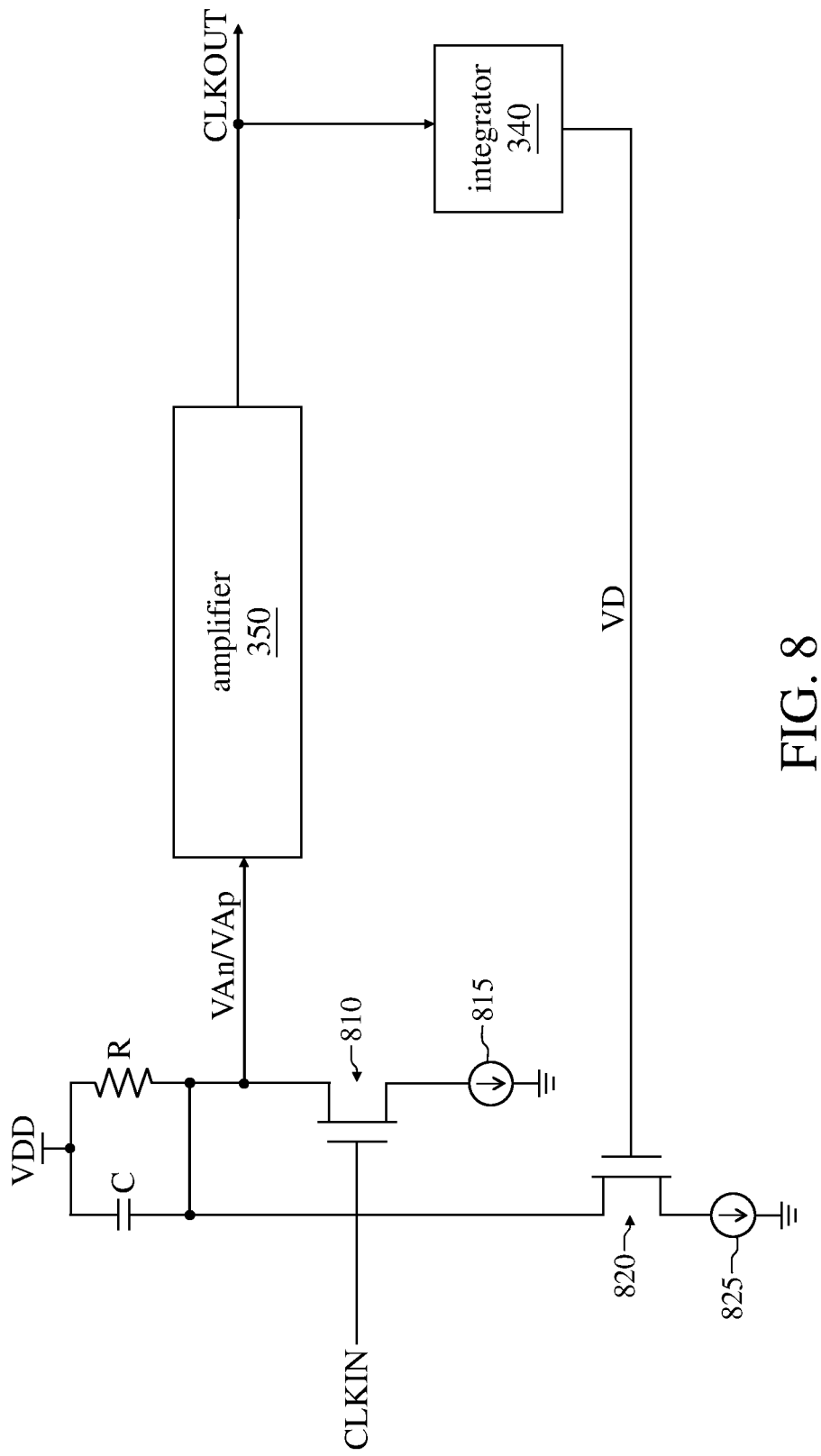
FIG. 8 illustrates a circuit diagram of a clock adjustment circuit according to another embodiment of the present disclosure.

FIG. 8 is a circuit diagram of a clock adjustment circuit according to another embodiment of the present disclosure.

The gate of the transistor 810 receives the input clock CLKIN, the intermediate clock VAn or the intermediate clock VAp is outputted through the drain of the transistor 810, and the source of the transistor 810 is coupled to the first reference voltage (e.g., ground) through the current source 815. One end of the capacitor C is coupled to the drain of the transistor 810, and the other end is coupled to the second reference voltage (e.g., the voltage source VDD). One end of the resistor R is coupled to the drain of the transistor 810, and the other end is coupled to the second reference voltage. The gate of the transistor 820 receives the control signal VD, the drain of the transistor 820 is coupled to the drain of the transistor 810, and the source of the transistor 820 is coupled to the first reference voltage through the current source 825. The circuit of FIG. 6 is based on a differential signal, while the circuit of FIG. 8, which is a modification of the circuit of FIG. 6, is a circuit implementation based on a single-ended signal.

Figure 9:
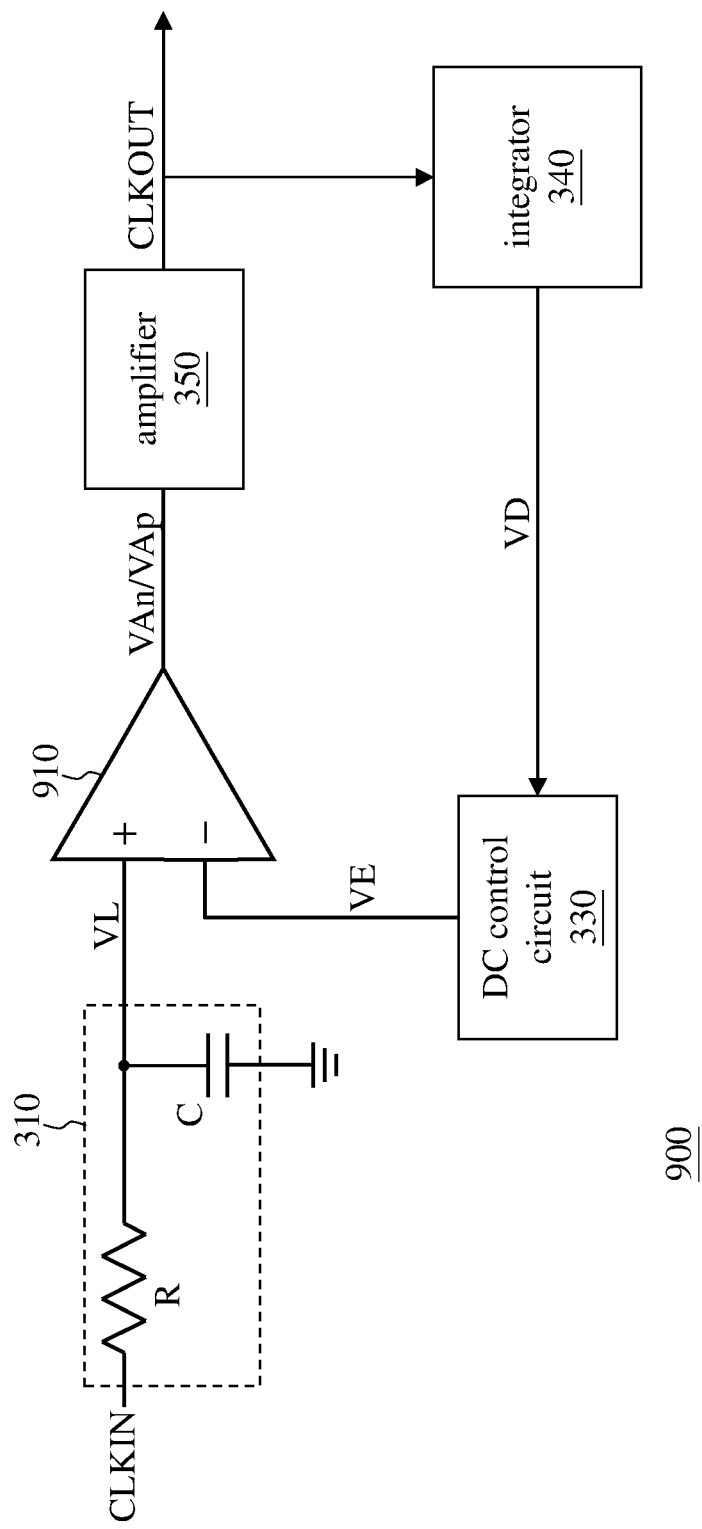
FIG. 9 illustrates a circuit diagram of a clock adjustment circuit according to another embodiment of the present disclosure.

FIG. 9 is a circuit diagram of a clock adjustment circuit according to another embodiment of the present disclosure. The clock adjustment circuit 900 includes the low-pass filter 310, an amplifier 910, the DC control circuit 330, the integrator 340, and the amplifier 350. The low-pass filter 310 is implemented by a resistor R and a capacitor C. The amplifier 910 receives the filtered signal VL at its non-inverting (positive) input, receives a DC voltage VE at its inverting (negative) input, and outputs the intermediate clock VAn or the intermediate clock VAp.

Figure 10:
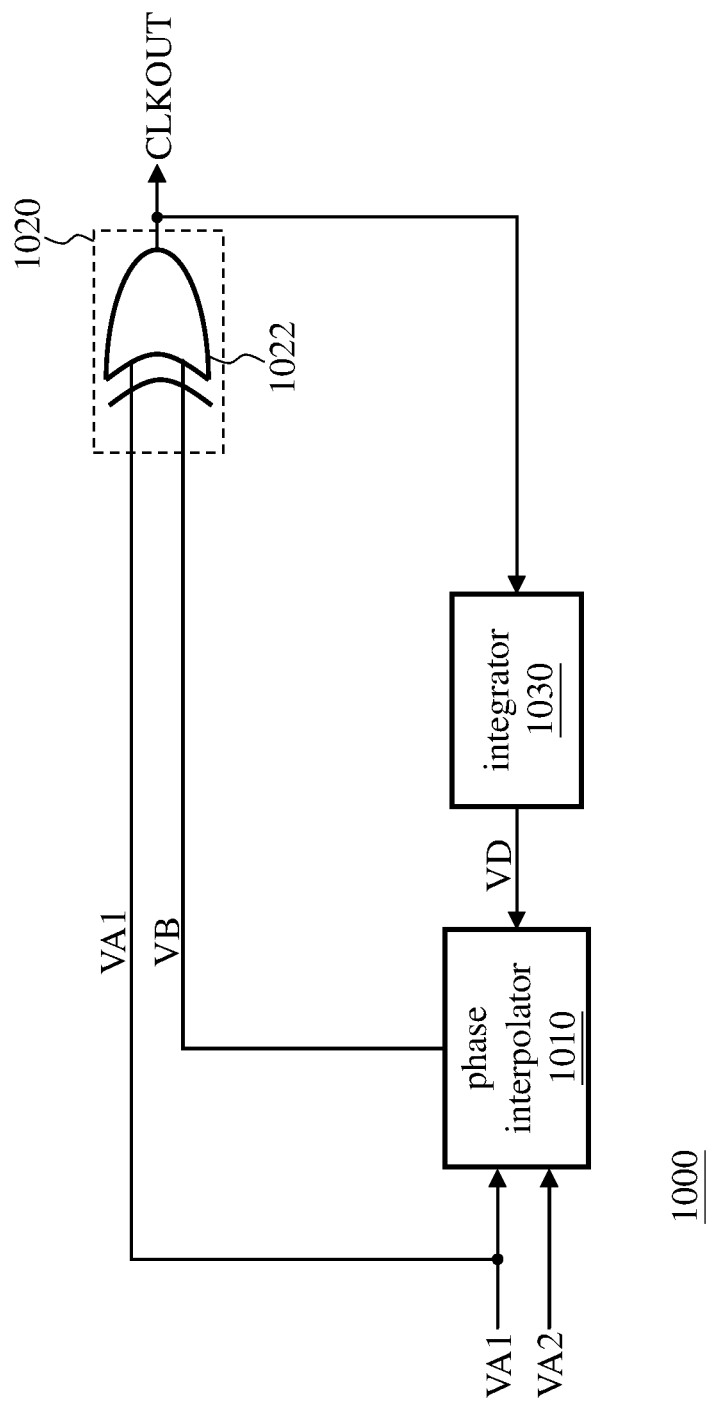
FIG. 10 illustrates a circuit diagram of a clock adjustment circuit according to another embodiment of the present disclosure.
Figure 11:
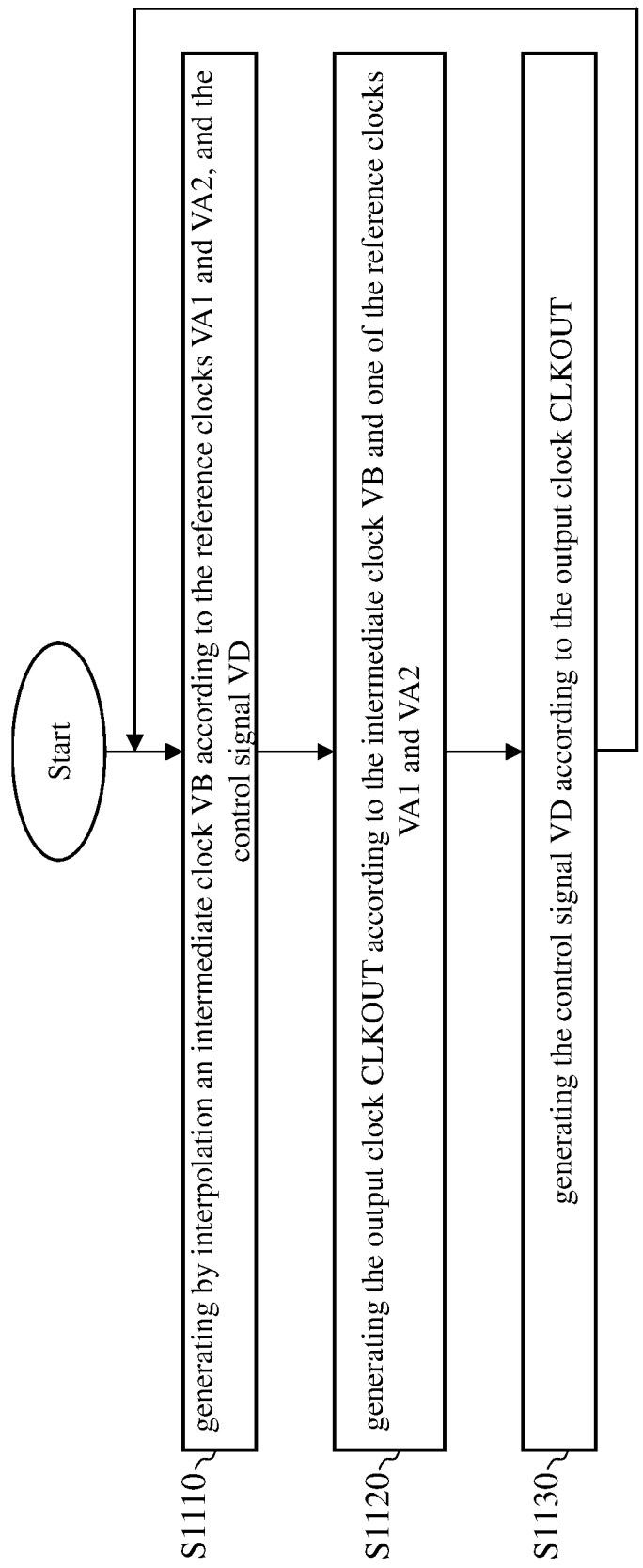
FIG. 11 illustrates a flowchart of the clock adjustment method according to an embodiment of the present disclosure.
Figure 12:
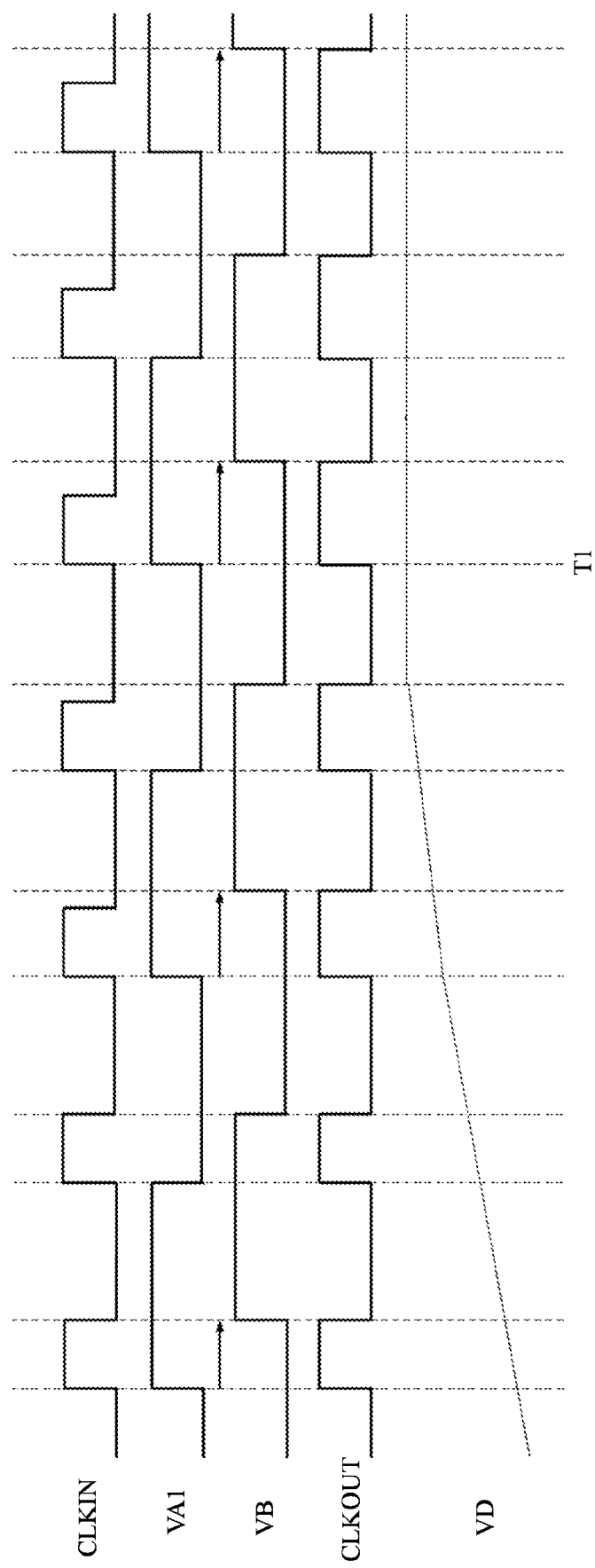
FIG. 12 illustrates the waveform of each signal in FIG. 10.

FIG. 10 is a circuit diagram of a clock adjustment circuit according to another embodiment of the present disclosure. The clock adjustment circuit 1000 includes a phase interpolator 1010, a logic circuit 1020, and an integrator 1030. FIG. 11 is a flowchart of the clock adjustment method according to an embodiment of the present disclosure (corresponding to the device of FIG. 10), and FIG. 12 shows the waveform of each signal in FIG. 10.

The phase interpolator 1010 generates an intermediate clock VB, by interpolation, according to the reference clock VA1, the reference clock VA2, and the control signal VD (step S1110). The frequencies of the reference clock VA1, the reference clock VA2, and the intermediate clock VB are substantially the same. FIG. 12 depicts only the reference clock VA1, and the phase difference between the reference clock VA1 and the reference clock VA2 is related to the duty cycle of the output clock CLKOUT. In some embodiments, the phase difference between the reference clock VA2 and the reference clock VA1 determines the extent to which the duty cycle can be adjusted. The phase interpolator 1010 adjusts the phase of the intermediate clock VB according to the control signal VD, leading to a change in the phase of the intermediate clock VB with respect to the phase of the reference clock VA1 and the phase of the reference clock VA2, and the phase of the intermediate clock VB falls between the reference clock VA1 and the reference clock VA2.

In some embodiments, the phase difference between the reference clock VA1 and the reference clock VA2 may be between $\pi/4$ and $3\pi/4$.

In some embodiments, the duty cycles of the reference clock VA1 and reference clock VA2 are substantially 50%. The logic circuit 1020 generates the output clock CLKOUT according to the intermediate clock VB and one of the reference clocks VA1 and VA2 (step S1120). As shown in FIG. 12, the output clock CLKOUT is the result of the exclusive-OR operation on the reference clock VA1 and the intermediate clock VB; thus, the logic circuit 1020 can be implemented by the XOR gate 1022 or a circuit equivalent to the XOR gate 1022.

The integrator 1030 generates the control signal VD according to the output clock CLKOUT (step S1130). The control signal VD varies with the average based on the duty cycle of the output clock CLKOUT. The integrator 1030 has substantially the same function as the integrator 340, and the details of the integrator 1030 are thus omitted herein for brevity. As shown in FIG. 12, when the duty cycle of the output clock CLKOUT is smaller than the target value (e.g., 50%) (i.e., before time T1), the voltage level of the control signal VD increases. Before the voltage level of the control signal VD becomes stable (i.e., before time T1), the phase interpolator 1010 keeps adjusting the phase of the intermediate clock VB according to the control signal VD. The clock adjustment circuit 1000 automatically repeats steps S1110 to S1130. As the phase of the intermediate clock VB changes, the duty cycle of the output clock CLKOUT gradually approaches the target value; thus, the purpose of adjusting the clock duty cycle is achieved.

In the embodiment of FIG. 10, the frequencies of the clocks inputted to the clock adjustment circuit 1000 (i.e., the reference clock VA1 and the reference clock VA2) are a half of the frequency of the output clock CLKOUT.

Figure 13:
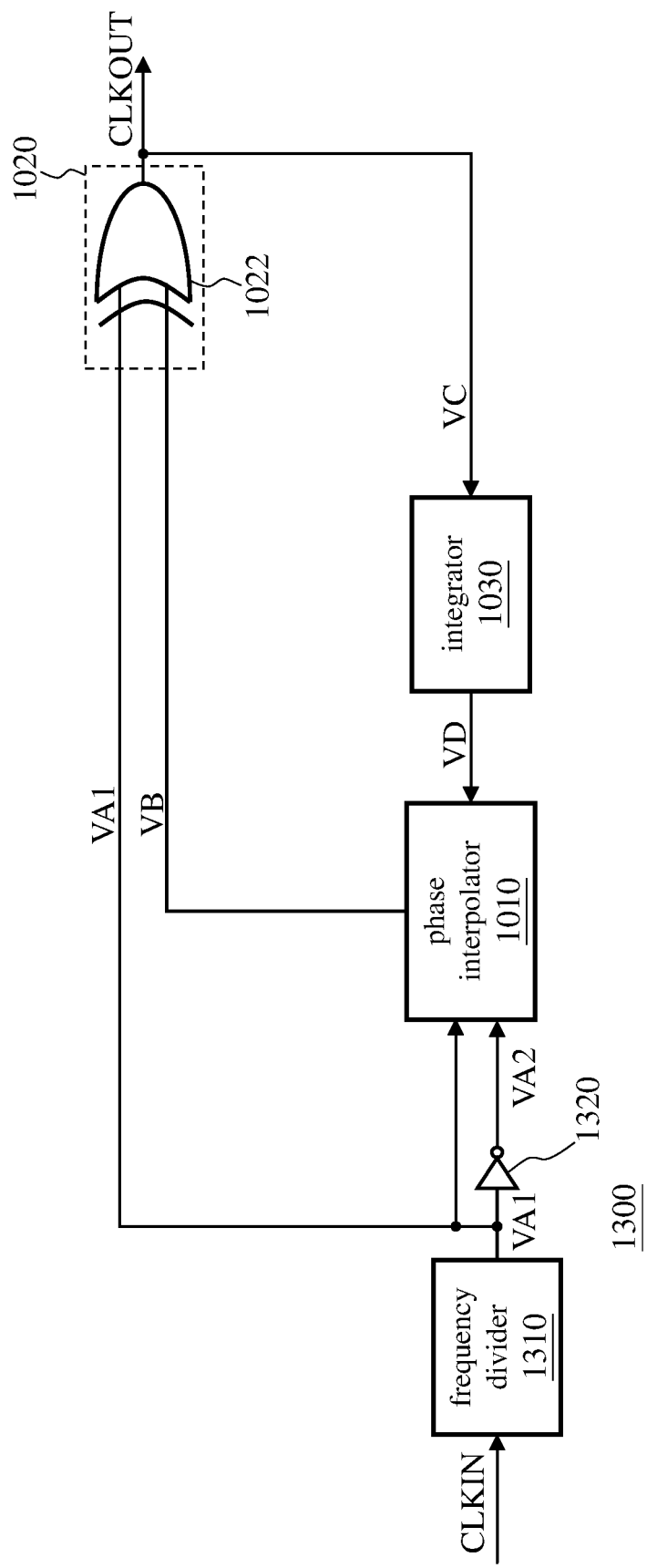
FIG. 13 illustrates a circuit diagram of a clock adjustment circuit according to another embodiment of the present disclosure.

FIG. 13 is a circuit diagram of a clock adjustment circuit according to another embodiment of the present disclosure. The clock adjustment circuit 1300 includes a frequency divider 1310, a phase interpolator 1010, a logic circuit 1020, and an integrator 1030. In this embodiment, the reference clock VA1 is a clock that the frequency divider 1310 generates by dividing the input clock CLKIN (e.g., dividing by 2, so that the frequency of the reference clock VA1 is a half of the frequency of the input clock CLKIN), and the reference clock VA1 is delayed by the delay circuit 1320 to generate the reference clock VA2. In this embodiment, the delay circuit 1320 is exemplified by an inverter, and the reference clock VA2 is an inverted signal of the reference clock VA1. The phase difference between the reference clock VA1 and the reference clock VA2 is substantially $\pi/2$, the duty cycles of the reference clock VA1 and the reference clock VA2 are 50%, and the frequency of the input clock CLKIN is the same as the frequency of the output clock CLKOUT.

Figure 14:
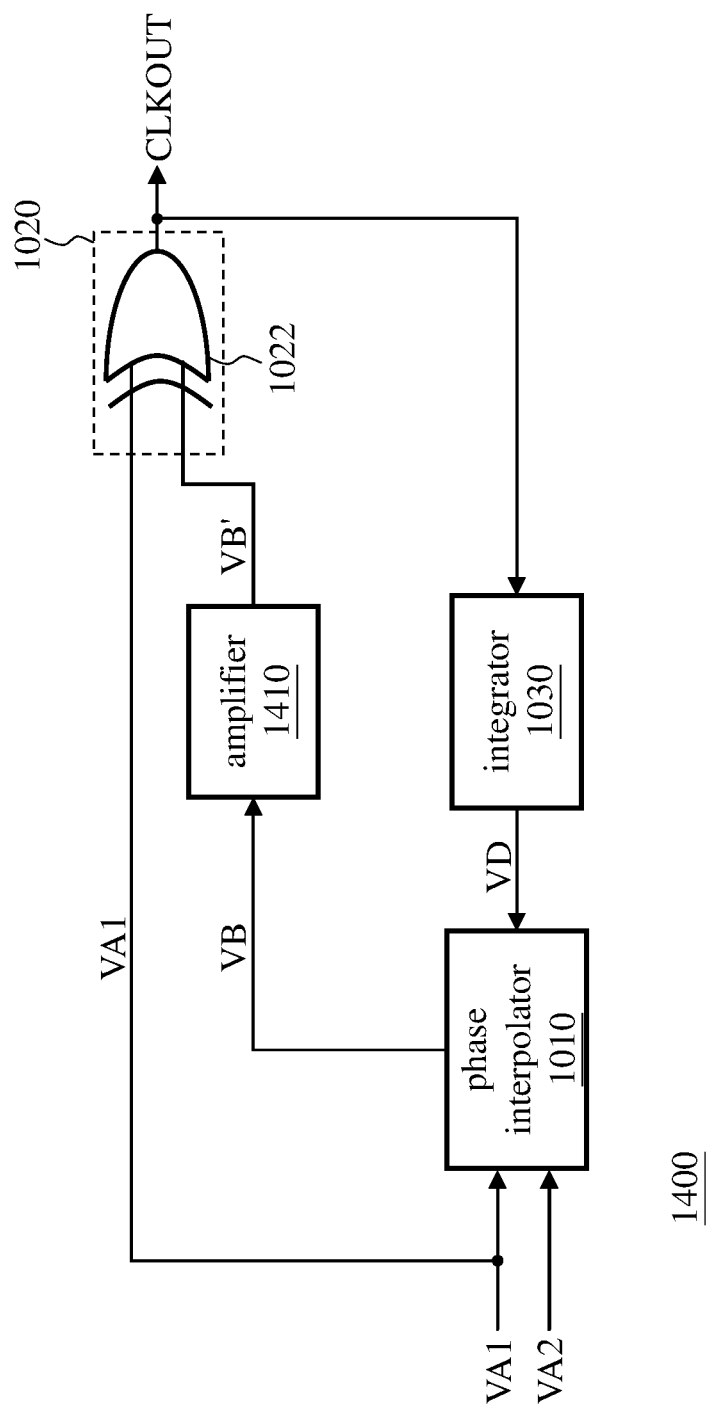
FIG. 14 illustrates a circuit diagram of a clock adjustment circuit according to another embodiment of the present disclosure.

FIG. 14 is a circuit diagram of a clock adjustment circuit according to another embodiment of the present disclosure. The clock adjustment circuit 1400 includes a phase interpolator 1010, a logic circuit 1020, an integrator 1030, and an amplifier 1410. The amplifier 1410 amplifies the intermediate clock VB to output the amplified intermediate clock VB'. The logic circuit 1020 generates the output clock CLKOUT according to the amplified intermediate clock VB' and one of the reference clocks VA1 and VA2. The amplified intermediate clock VB' has a larger amplitude than the intermediate clock VB and may be closer to a square wave. That is, the amplifier 1410 has a function of amplitude adjustment and/or wave shaping.

Figure 15:
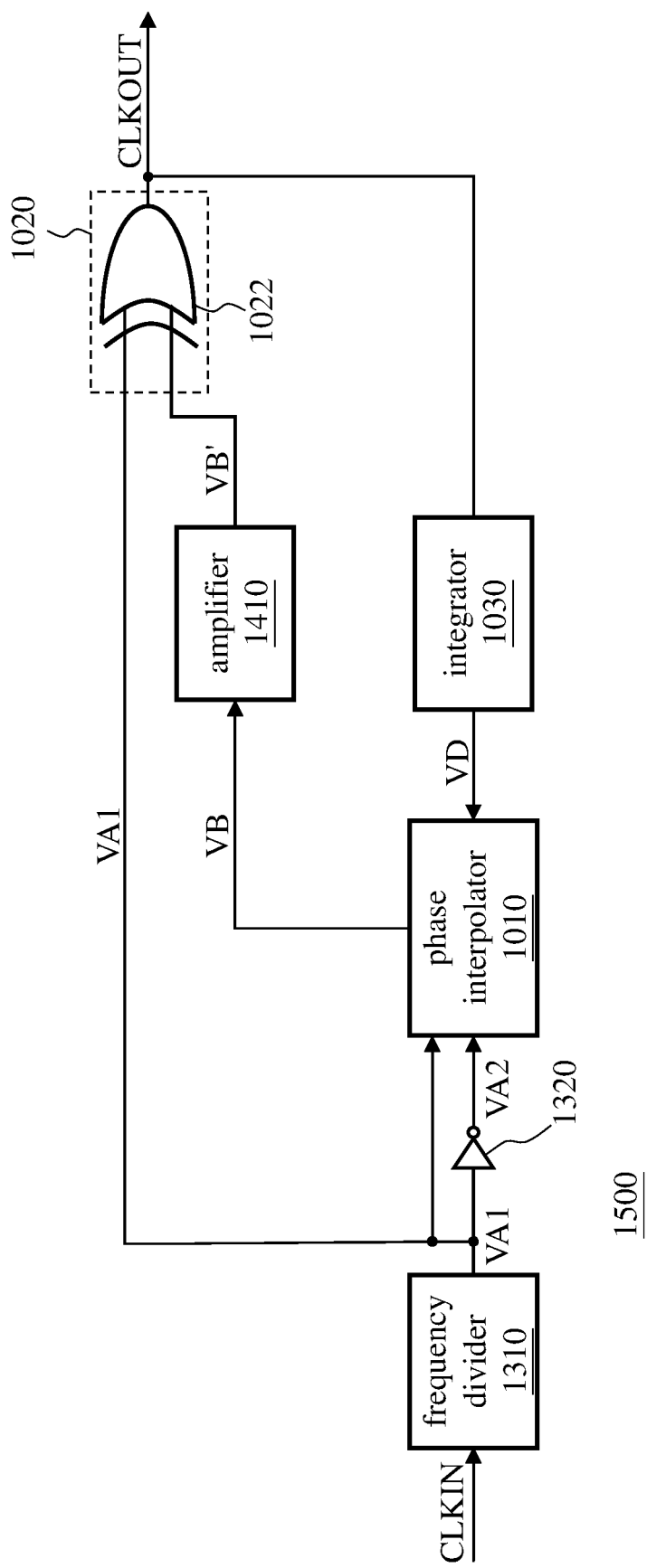
FIG. 15 illustrates a circuit diagram of a clock adjustment circuit according to another embodiment of the present disclosure.
Figure 16:
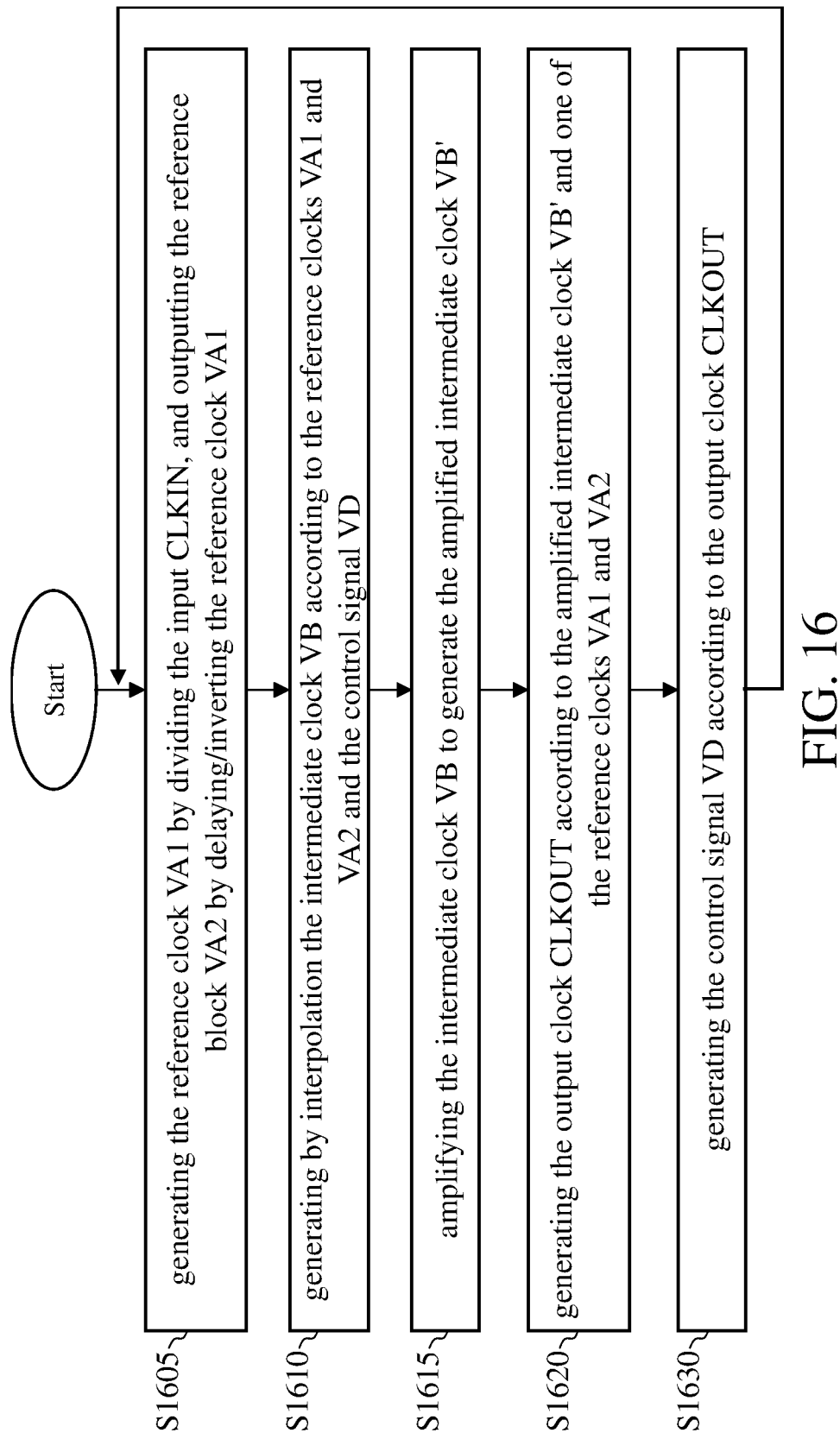
FIG. 16 illustrates a flowchart of the clock adjustment method according to an embodiment of the present disclosure.

FIG. 15 is a circuit diagram of a clock adjustment circuit according to another embodiment of the present disclosure. The clock adjustment circuit 1500 includes a phase interpolator 1010, a logic circuit 1020, an integrator 1030, a frequency divider 1310, a delay circuit 1320, and an amplifier 1410. FIG. 16 is a flowchart of the clock adjustment method according to an embodiment of the present disclosure (corresponding to the device of FIG. 15). The operations of the frequency divider 1310 and the delay circuit 1320 can be referred to step S1605; the operations of the phase interpolator 1010 can be referred to step S1610; the operations of the amplifier 1410 can be referred to step S1615; the operations of the logic circuit 1020 can be referred to step S1620; and the operations of the integrator 1030 can be referred to step S1630. These steps are detailed in the embodiments of FIGS. 10 and 13-14 and are thus omitted herein for brevity.

In some embodiments, the delay circuit 1320 can be replaced with another delay circuit, e.g., a delay cell, such that the phase difference between the reference clock VA1 and the reference clock VA2 can be adjusted.

Figure 17:
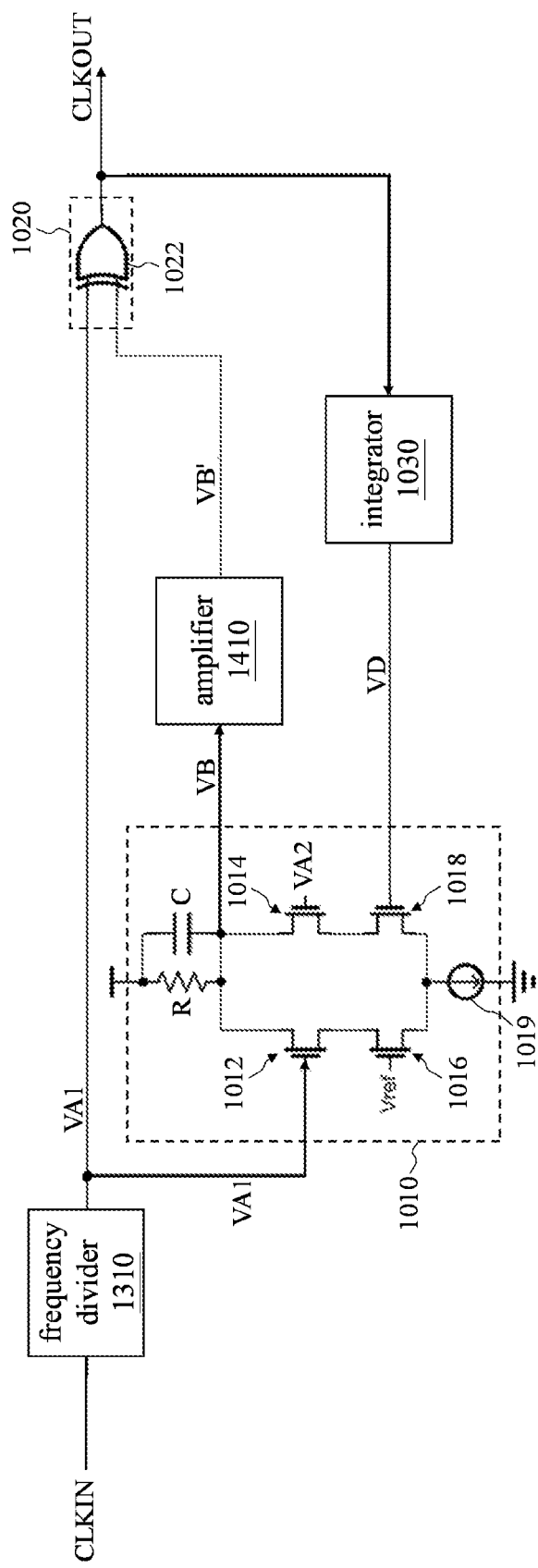
FIG. 17 illustrates shows an embodiment of a detailed circuit of the phase interpolator 1010.

FIG. 17 shows an embodiment of a detailed circuit of the phase interpolator 1010. The phase interpolator 1010 includes a resistor R, a capacitor C, transistors 1012, 1014, 1016, and 1018, and a current source 1019. In the embodiment of FIG. 17, the transistors 1012 to 1018 are implemented by N-type Metal-Oxide-Semiconductor Field-Effect Transistors (NMOSFETs). The transistor 1012 receives the reference clock VA1 through its gate and outputs the intermediate clock VB through its drain. The transistor 1014 receives the reference clock VA2 through its gate, and its drain is electrically connected to the drain of the transistor 1012. The transistor 1016 receives a reference signal Vref, which may be a constant voltage, through its gate, its drain is electrically connected to the source of the transistor 1012, and its source is coupled to the first reference voltage (e.g., ground) through the current source 1019. The transistor 1018 receives the control signal VD through its gate, its drain is electrically connected to the source of the transistor 1014, and its source is coupled to the first reference voltage through the current source 1019. One end of the resistor R is coupled to the drain of the transistor 1012, and the other end is coupled to a second reference voltage (e.g., the voltage source). The capacitor C is connected in parallel with the resistor R.

The phase interpolator 1010 of FIG. 17 mixes the reference clock VA1 and the reference clock VA2 and uses a filter (using the resistor R and the capacitor C as a filtering circuit) to produce a phase interpolation to thereby generate the intermediate clock VB.

Since a person having ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flow chart in the disclosed figures are exemplary for understanding, not for limiting the scope of this disclosure.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A clock adjustment circuit configured to generate an output clock, comprising:
   a phase interpolator configured to generate by interpolation an intermediate clock according to a first reference clock, a second reference clock, and a control signal, wherein the frequency of the first reference clock, the frequency of the second reference clock, and the frequency of the intermediate clock are substantially the same;
   a logic circuit coupled to the phase interpolator and configured to generate the output clock according to the intermediate clock and one of the first reference clock and the second reference clock; and
   an integrator coupled to the phase interpolator and the logic circuit and configured to generate the control signal according to the output clock, wherein the control signal varies with an average based on a duty cycle of the output clock;
   wherein the phase interpolator comprises:
      a first transistor having a first gate, a first drain, and a first source, wherein the first gate receives the first reference clock, and the intermediate clock is outputted through the first drain;
      a second transistor having a second gate, a second drain, and a second source, wherein the second gate receives the second reference clock, and the second drain is electrically connected to the first drain;
      a third transistor having a third gate, a third drain, and a third source, wherein the third gate receives a reference signal, the third drain is electrically connected to the first source, and the third source is coupled to a first reference voltage;
      a fourth transistor having a fourth gate, a fourth drain, and a fourth source, wherein the fourth gate receives the control signal, the fourth drain is electrically connected to the second source, and the fourth source is coupled to the first reference voltage;
      a capacitor with one end of which coupled to the first drain and the other end of which coupled to a second reference voltage; and
      a resistor with one end of which coupled to the first drain and the other end of which coupled to the second reference voltage.

2. The clock adjustment circuit of claim 1 further comprising:
   a frequency divider coupled to the phase interpolator and configured to generate the first reference clock by dividing an input clock; and
   a delay circuit coupled to the frequency divider and the phase interpolator and configured to delay the first reference clock to output the second reference clock;
   wherein the frequency of the first reference clock and the frequency of the second reference clock are substantially a half of the frequency of the input clock.

3. The clock adjustment circuit of claim 2, wherein the delay circuit is an inverter.

4. The clock adjustment circuit of claim 1, wherein a phase difference between the first reference clock and the second reference clock is substantially 180 degrees.

5. The clock adjustment circuit of claim 1, wherein the duty cycle of the first reference clock and the duty cycle of the second reference clock are substantially 50%.

6. A clock adjustment circuit configured to generate an output clock, comprising:
   a phase interpolator configured to generate by interpolation an intermediate clock according to a first reference clock, a second reference clock, and a control signal, wherein the frequency of the first reference clock, the frequency of the second reference clock, and the frequency of the intermediate clock are substantially the same;
   an amplifier coupled to the phase interpolator and configured to amplify the intermediate clock to generate an amplified intermediate clock;
   a logic circuit coupled to the amplifier and configured to generate the output clock according to the amplified intermediate clock and one of the first reference clock and the second reference clock; and an integrator coupled to the phase interpolator and the logic circuit and configured to generate the control signal according to the output clock, wherein the control signal varies with an average based on a duty cycle of the output clock;

wherein the phase interpolator comprises:
- a first transistor having a first gate, a first drain, and a first source, wherein the first gate receives the first reference clock, and the intermediate clock is outputted through the first drain;
- a second transistor having a second gate, a second drain, and a second source, wherein the second gate receives the second reference clock, and the second drain is electrically connected to the first drain;
- a third transistor having a third gate, a third drain, and a third source, wherein the third gate receives a reference signal, the third drain is electrically connected to the first source, and the third source is coupled to a first reference voltage;
- a fourth transistor having a fourth gate, a fourth drain, and a fourth source, wherein the fourth gate receives the control signal, the fourth drain is electrically connected to the second source, and the fourth source is coupled to the first reference voltage;
- a capacitor with one end of which coupled to the first drain and the other end of which coupled to a second reference voltage; and
- a resistor with one end of which coupled to the first drain and the other end of which coupled to the second reference voltage.

7. The clock adjustment circuit of claim 6, further comprising:
- a frequency divider coupled to the phase interpolator and configured to generate the first reference clock by dividing an input clock; and
- a delay circuit coupled to the frequency divider and the phase interpolator and configured to delay the first reference clock to output the second reference clock;
- wherein the frequency of the first reference clock and the frequency of the second reference clock are substantially a half of the frequency of the input clock.

8. The clock adjustment circuit of claim 7, wherein the delay circuit is an inverter.

9. The clock adjustment circuit of claim 6, wherein a phase difference between the first reference clock and the second reference clock is substantially 180 degrees.

10. The clock adjustment circuit of claim 6, wherein the duty cycle of the first reference clock and the duty cycle of the second reference clock are substantially 50%.

* * * * *